United States Patent
Spaeth

(10) Patent No.: US 8,536,944 B2
(45) Date of Patent: Sep. 17, 2013

(54) DIFFERENTIAL AMPLIFIER WITH DE-EMPHASIS

(75) Inventor: Mark Spaeth, Hudson, MA (US)

(73) Assignee: Cavium, Inc., San Jose, CA (US)

(*) Notice: Subject to any disclaimer, the term of this patent is extended or adjusted under 35 U.S.C. 154(b) by 77 days.

(21) Appl. No.: 13/397,550

(22) Filed: Feb. 15, 2012

(65) Prior Publication Data
US 2012/0206200 A1    Aug. 16, 2012

Related U.S. Application Data

(60) Provisional application No. 61/443,067, filed on Feb. 15, 2011.

(51) Int. Cl.
*H03F 3/45* (2006.01)

(52) U.S. Cl.
USPC ............................................. 330/252

(58) Field of Classification Search
USPC .................................................. 330/252–261
See application file for complete search history.

(56) References Cited

U.S. PATENT DOCUMENTS

| | | | | |
|---|---|---|---|---|
| 7,259,628 | B2* | 8/2007 | Huang et al. | 330/261 |
| 8,154,338 | B2* | 4/2012 | Zhang | 330/9 |

* cited by examiner

*Primary Examiner* — Hieu Nguyen
(74) *Attorney, Agent, or Firm* — Hamilton, Brook, Smith & Reynolds, P.C.

(57) ABSTRACT

A programmable current driver provides de-emphasis capability. A number of identical transmitter slices, consisting of a unit current source and a unit differential pair, are connected in parallel to the termination resistors. As the transmitter slices are identical, the current density through the differential pairs are identical, and the VDS voltages across them (as well as the VDS voltages across the unit current sources) are the same, ensuring that the current through each slice is identical (within the limits of device matching). Biasing circuitry ensures that each unit current source sinks a current having a fixed proportion to the total current.

7 Claims, 5 Drawing Sheets

DIFFERENTIAL AMPLIFIER WITH DE-EMPHASIS

RELATED APPLICATION

This application claims the benefit of U.S. Provisional Application No. 61/443,067, filed on Feb. 15, 2011. The entire teachings of the above application are incorporated herein by reference

BACKGROUND

In a differential amplifier, de-emphasis provides for transmission at a lower differential amplitude on a bit-by-bit basis while maintaining the same common-mode level. Common high speed differential serial links require de-emphasis to compensate for high frequency losses in the channel. In a current mode transmitter, this is accomplished by varying the ratio of currents sunk by parallel-connected differential transmitters connected to a differential pair of output pins, each terminated by a pull-up impedance.

SUMMARY

Embodiments of the present invention provide a programmable current driver with de-emphasis capability. A number of identical transmitter slices, consisting of a unit current source and a unit differential pair, are connected in parallel to the termination resistors. As the transmitter slices are identical, the current density through the differential pairs are identical, and the $V_{DS}$ voltages across them (as well as the $V_{DS}$ voltages across the unit current sources) are the same, ensuring that the current through each slice is identical (within the limits of device matching). Biasing circuitry ensures that each unit current source sinks a current having a fixed proportion to the total current. With this structure, any number of slices (d<N/2) may be programmed to transmit with the opposite polarity to achieve a de-emphasized differential amplitude.

Embodiments of the invention provide a differential amplifier including an output pair and a plurality of blocks (slices). The output pair is connected to a voltage source and generates a differential output. The plurality of blocks are coupled in parallel to the differential output pair, and each include a programmable current source and a differential pair. The differential pair may be connected between respective nodes of the output pair and the current source. The amplitude of the differential output may be a function of a ratio of the blocks enabled under each of a plurality of polarities.

In further embodiments, the amplitude of the differential output may be a function of a ratio of the blocks enabled under a first polarity to the blocks enabled under a second polarity. Each of the plurality of blocks may be configured to sink an identical current when enabled under a given polarity. The programmable current sources and differential pairs may be identical among the at least two of the plurality of blocks, or may be identical among all of the plurality of blocks. In particular, the circuit structure and components of each of the blocks may be identical.

In still further embodiments, the programmable current source may include at least two transistors coupled in parallel, each of the transistors being enabled by a respective bias node. The differential pair may include at least two transistors, each of the transistors being enabled by one of a respective control signal and its complement.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1:
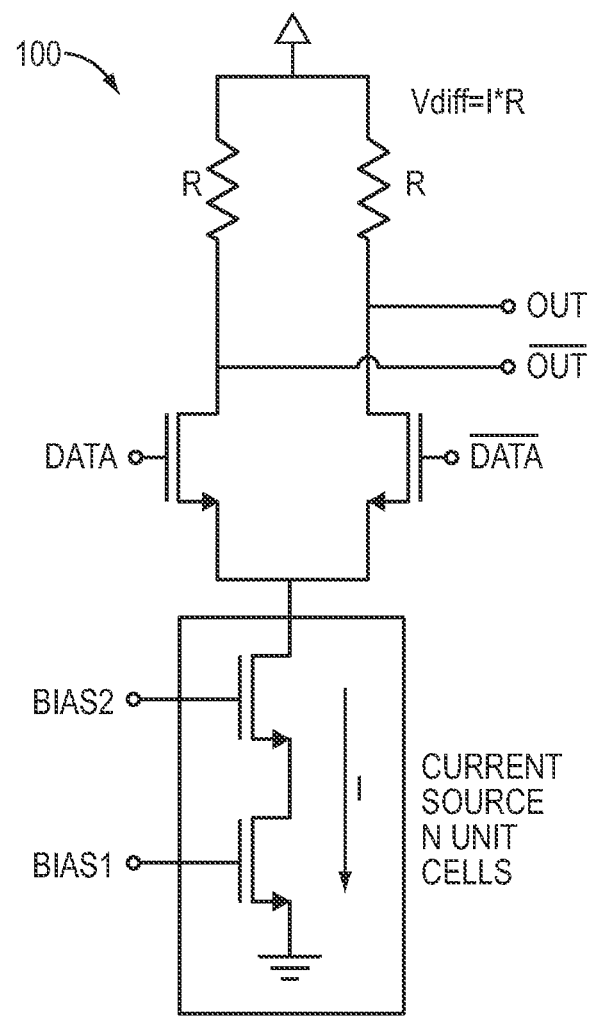
FIG. 1 is a circuit diagram of a typical current-mode differential amplifier.

FIG. 1 is a circuit diagram of a typical current-mode differential amplifier 100. Current-mode transmitters use a tail current source to sink current I, and a differential pair (transistors connected to Data and !Data) to fully switch this current between the two differential output paths (Out and !Out).

Many high speed differential serial links require de-emphasis, which is transmission of non-transition bits at a lower differential amplitude on a bit-by-bit basis while maintaining the same common-mode level. De-emphasis compensates for high frequency losses in the channel by reducing the magnitude of low frequency content of the signal. In a current mode transmitter (Tx), this is accomplished by varying the ratio of currents sunk by parallel-connected differential transmitters connected to a differential pair of output pins, each terminated by a pull-up impedance R. For a Tx with currents $I/2 \pm \alpha$, the common-mode level is $Vdd-(I/2*R)$, and the differential amplitude is $2*\alpha*R$.

Figure 2:
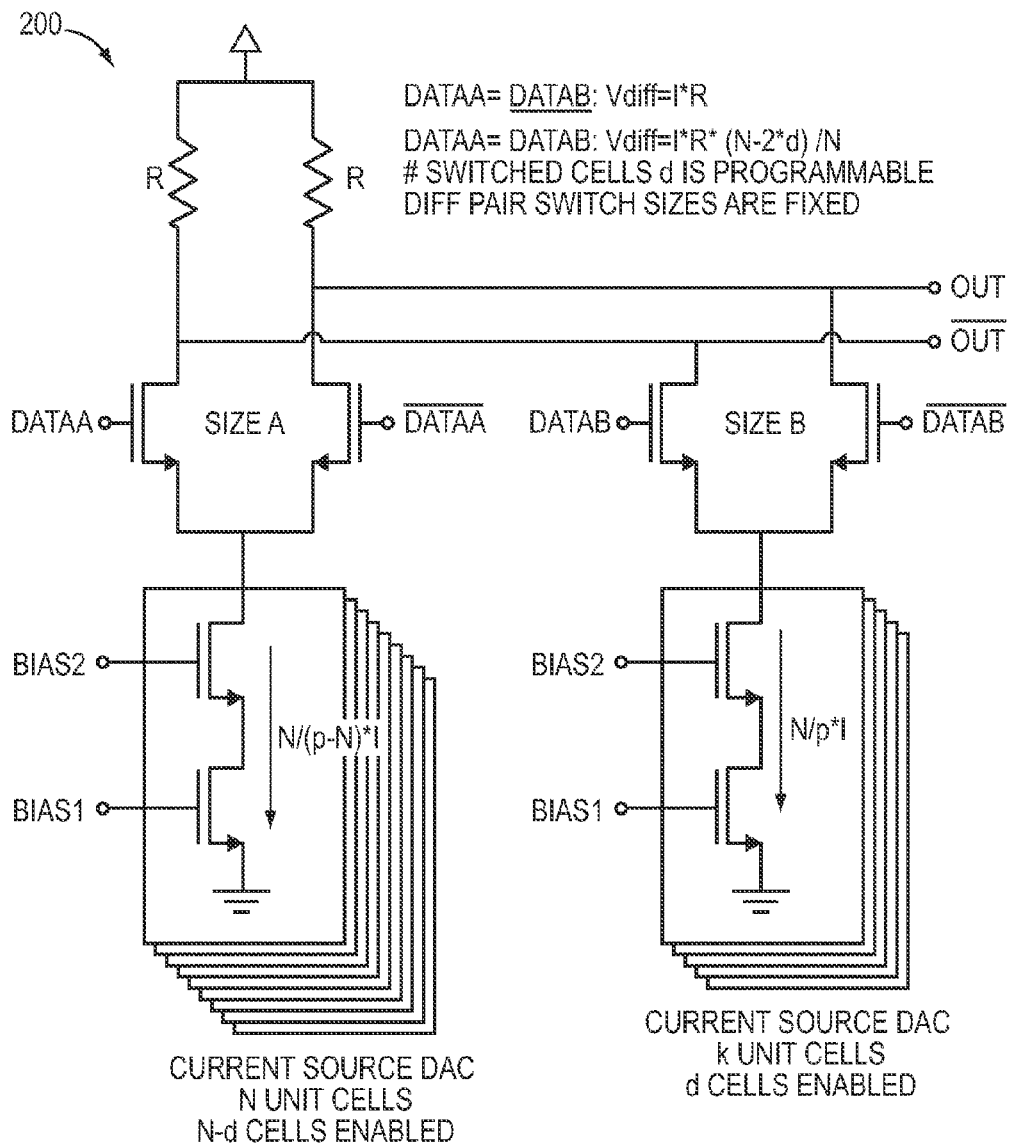
FIG. 2 is a circuit diagram of a typical current-mode differential amplifier with de-emphasis capability.

FIG. 2 is a circuit diagram of a typical current-mode differential amplifier 200 with de-emphasis capability. De-emphasized transmission is achieved by reducing the current in the primary transmitter to $(I-\beta)$ and adding a second transmitter in parallel with current $\beta$ (with $\beta<I/2$). When the primary and secondary transmitters output the same value, the currents through the termination resistors sum, and the differential amplitude is $R*[(I-\beta)+\beta]=I*R$. When the main and secondary transmitters output opposing values, the differential amplitude is $R*[(I-\beta)-\beta]=(I-2*\beta)*R<I*R$, and the reduced output swing is achieved.

The differential amplifier 200 employs current mode digital-to-analog converters (DACs) as tail current sources for the primary and secondary transmitters, with current I determined by the total current between the DACs, and a the digital code d<N/2 controlling the DACs determines $\beta$ $I*d/N$, making the de-emphasis level programmable. A major limitation of this scheme is that the differential pairs used to switch the two primary and secondary currents onto the termination resistors are fixed in size, so that as the de-emphasis setting changes, the current density though the differential pairs change, and the drain-source voltage ($V_{DS}$) needed to support the differing current densities does not track between the primary and secondary paths. Because the drain nodes of the differential pairs are tied together, the $V_{DS}$ difference forces differing voltages at the common source nodes of the two differential pairs and thus different $V_{DS}$ voltages across the two current sources. Due to the limited output impedance of the current sources (especially in deep sub-micron technology nodes and in circuits with limited voltage headroom), the differing $V_{DS}$ voltages across the current sources will cause the ratio between the currents to stray from the ideal $2*(I-\beta)$ vs. $2*\beta$ ratio, so the desired de-emphasis ratios cannot be achieved. The two differential pairs must be sized to accommodate the maximum current in each DAC. Since by design, one or both DACs is programmed to sink less than its maximum current, the differential pairs are necessarily oversized and contribute excess capacitive loading to the output of the transmitter, degrading its performance. Additionally, since the current sources constituting the two current DACs are switched, N+k total unit current sources are required, and additional chip area is required.

Figure 3:
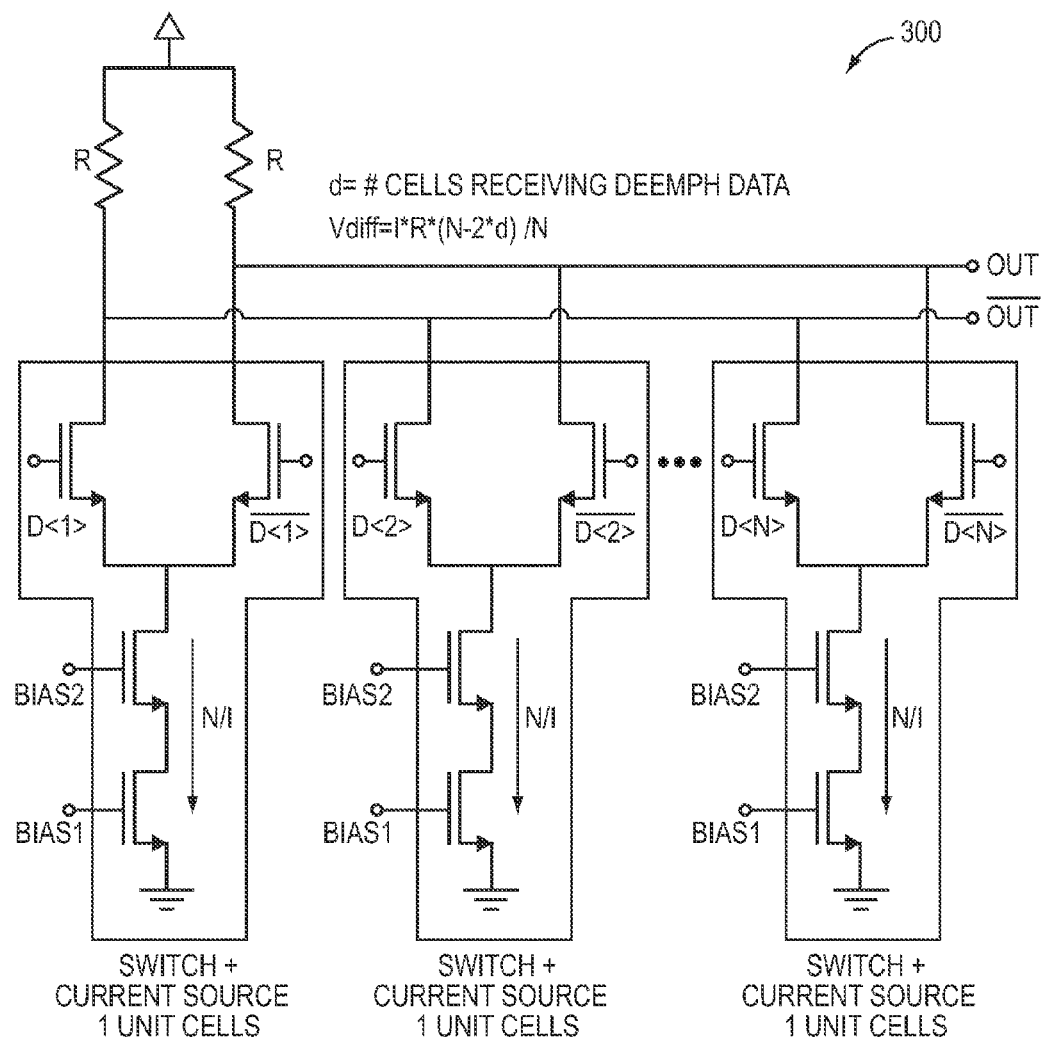
FIG. 3 is a circuit diagram of a differential amplifier in an example embodiment.

FIG. 3 is a circuit diagram of a differential amplifier 300 in an example embodiment of the present invention. The amplifier 300 addresses the limitations described above with reference to the amplifier 200 in FIG. 2. The amplifier 300 implements (in place of the programmable current DACs and monolithic differential pairs in FIG. 2) a number (N) of identical transmitter slices, each slice comprising a unit current source and a unit differential pair, connected in parallel to the termination resistors. As the transmitter slices are identical, the current density through the differential pairs are identical, and the $V_{DS}$ voltages across them are the same, so the $V_{DS}$ voltages across the unit current sources are the same, ensuring that the current through each slice is identical (within the limits of device matching). The biasing circuitry ensures that each unit current source sinks current I/n, such that the aggregate structure sinks the full I current. With this structure, any number of slices (d<N/2) may be programmed to transmit with the opposite polarity to achieve a de-emphasized differential amplitude. With all slices transmitting with the same polarity, a differential amplitude of $R*[(N-d)+d]*(I/n)=I*R$ is achieved (as before). With the de-emphasis slices transmitting with opposite polarity, a differential amplitude of $R*[(N-d)-d]*(I/N)=I*R*(N-2*d)/n$ is achieved (ie. $\beta=I*d/N$).

The amplifier 300 enables de-emphasis magnitude d to be varied in integer steps between 0 and N/2 to achieve the desired de-emphasis ratio. The granularity of the achievable de-emphasis ratios is determined by the total number of slices (N), and is given by 2/N. The range of achievable de-emphasis values is determined by the number of slices (d) where the transmit polarity may be switched, with a minimum de-emphasized transmission ratio of $(N-2*d)/N$.

Figure 4:
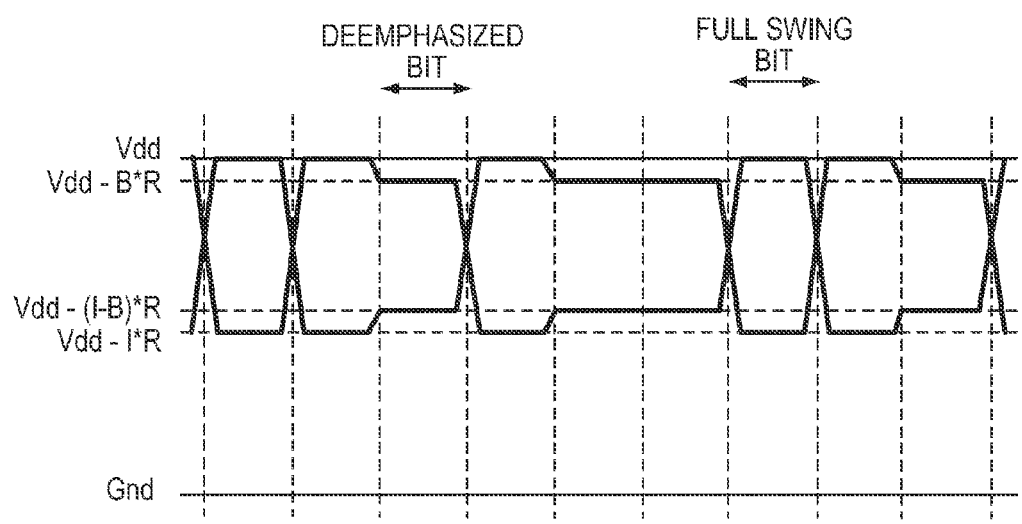
FIG. 4 is a timing diagram of a differential amplifier output providing de-emphasis.

FIG. 4 is a timing diagram of a differential amplifier output providing de-emphasis. A signal output bit without de-emphasis exhibits a voltage differential between Vdd and Vdd−I*R. In contrast, a de-emphasized bit exhibits a voltage differential between Vdd−I*d/N*R and Vdd−I*(N−d)/N*R.

Figure 5:
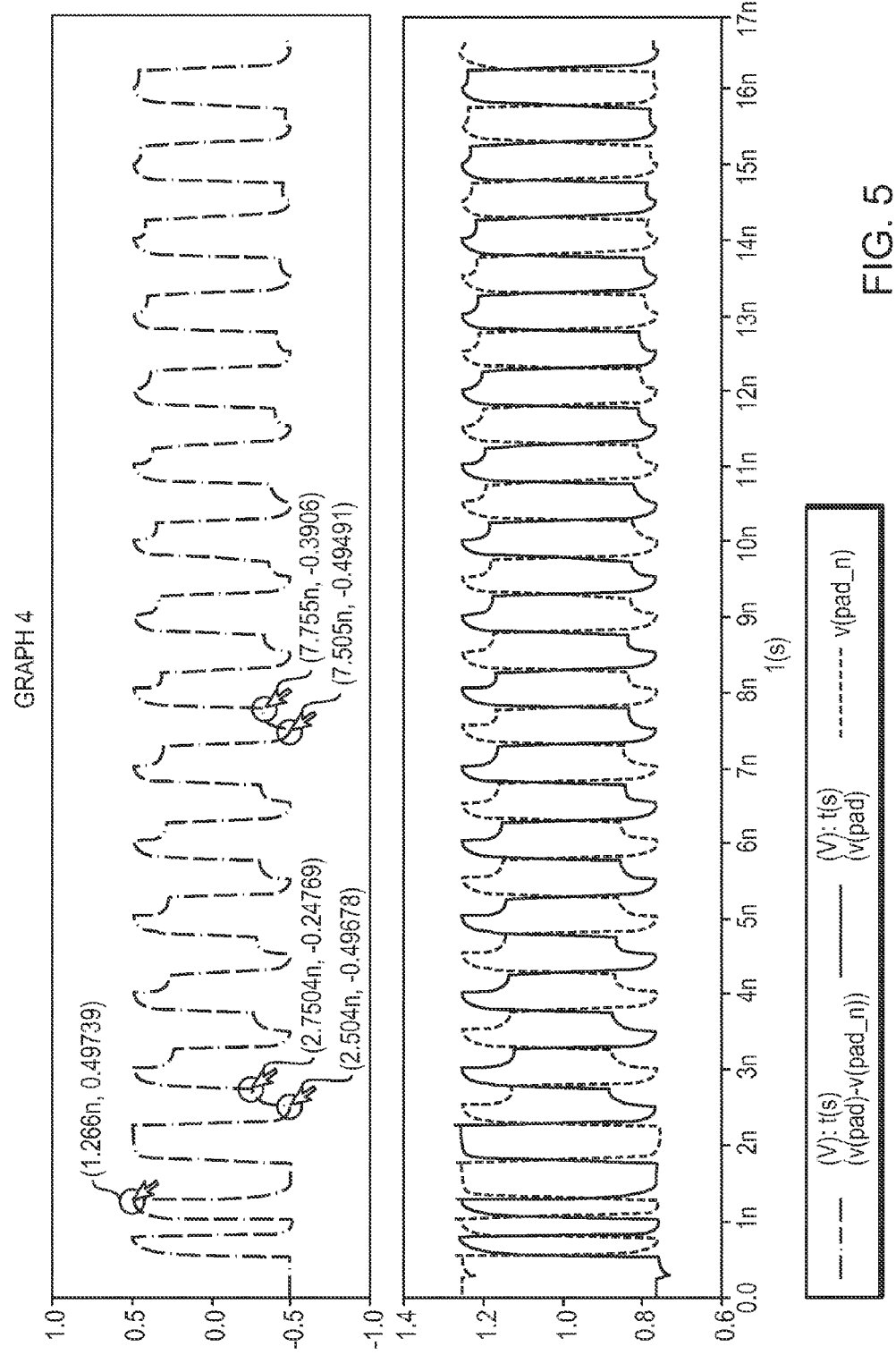
FIG. 5 is a timing diagram of a simulated operation of a differential amplifier implementing de-emphasis with the de-emphasis ratio swept across a range of values.

FIG. 5 is a timing diagram of a simulated operation of a differential amplifier implementing de-emphasis, with the de-emphasis ratio swept across a range of values.

An example embodiment of the invention demonstrated in simulation and verified in silicon circuitry. To achieve ⅓ (−3.5 dB) and ½ (−6 dB) de-emphasis ratios, and allow for programmability with other standards, the circuit was designed with N=60, and dmax=15 (4 bits), allowing for 0 dB de-emphasis with d=0, −3.5 dB de-emphasis with d=10, and −6 dB de-emphasis with d=15. To account for second order limitations in the measured de-emphasis levels, the fabricated circuit used N=58 slices, and allowed up to dmax=29 (5 bits) to demonstrate highly linear de-emphasis settings beyond the levels required for current SERDES standards.

While this invention has been particularly shown and described with references to example embodiments thereof, it will be understood by those skilled in the art that various changes in form and details may be made therein without departing from the scope of the invention encompassed by the appended claims.

What is claimed is:

1. A differential amplifier comprising:
an output pair connected to a voltage source and generating a differential output; and
a plurality of blocks coupled in parallel to the differential output pair, each block comprising:
a programmable current source; and
a differential pair connected between respective nodes of the output pair and the current source;
an amplitude of the differential output being a function of a ratio of the blocks enabled under each of a plurality of polarities.

2. The differential amplifier of claim 1, wherein the amplitude of the differential output is a function of a ratio of the blocks enabled under a first polarity to the blocks enabled under a second polarity.

3. The differential amplifier of claim 1, wherein each of the plurality of blocks is configured to sink an identical current when enabled under a given polarity.

4. The differential amplifier of claim 1, wherein the programmable current sources and differential pairs are identical among the at least two of the plurality of blocks.

5. The differential amplifier of claim 1, wherein the programmable current sources and differential pairs are identical among the plurality of blocks.

6. The differential amplifier of claim 1, wherein the programmable current source includes at least two transistors coupled in parallel, each of the transistors being enabled by a respective bias node.

7. The differential amplifier of claim 1, wherein the differential pair includes at least two transistors, each of the transistors being enabled by one of a respective control signal and its complement.

* * * * *